(12) United States Patent
Ishida et al.

(10) Patent No.: US 6,514,833 B1
(45) Date of Patent: Feb. 4, 2003

(54) METHOD OF INHIBITING LATERAL DIFFUSION BETWEEN ADJACENT WELLS BY INTRODUCING CARBON OR FLUORINE IONS INTO BOTTOM OF STI GROOVE

(75) Inventors: Emi Ishida, Sunnyvale, CA (US); Che-Hoo Ng, San Martin, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/667,600

(22) Filed: Sep. 22, 2000

Related U.S. Application Data
(60) Provisional application No. 60/155,554, filed on Sep. 24, 1999.

(51) Int. Cl.[7] ............................................. H01L 21/76
(52) U.S. Cl. ....................... 438/424; 438/199; 438/218; 438/221; 438/433; 438/524
(58) Field of Search ................................ 438/424, 433, 438/199, 218, 221, 223, 228, 440, 447, 449–451, 520, 524

(56) References Cited

U.S. PATENT DOCUMENTS 5,770,504 A * 6/1998 Brown et al. ........ 148/DIG. 40
6,037,640 A * 3/2000 Lee ............................ 257/344

* cited by examiner

Primary Examiner—Matthew Smith
Assistant Examiner—Craig P. Lytle

(57) ABSTRACT

Semiconductor devices comprising a plurality of active device regions formed in a common semiconductor substrate, e.g., CMOS devices, are formed by utilizing shallow trench isolation (STI) technology enhanced by selectively implanting the bottom surface of the trench with dopant diffusion inhibiting ions prior to filling the trench with a dielectric material and formation of opposite conductivity type well regions on either side of the trench. The inventive methodology effectively reduces or substantially eliminates deleterious counterdoping of the subsequently formed well regions resulting from thermally-induced lateral inter-diffusion of p-type and/or n-type dopant impurities used for forming the well regions.

20 Claims, 1 Drawing Sheet

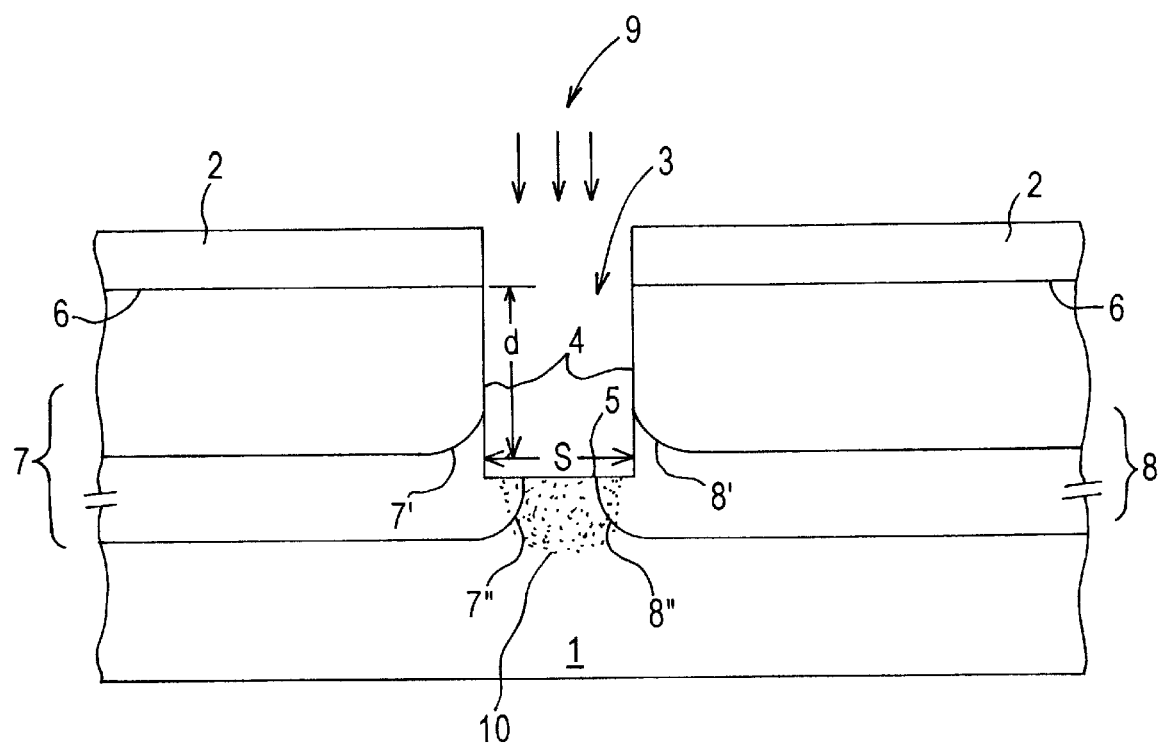

METHOD OF INHIBITING LATERAL DIFFUSION BETWEEN ADJACENT WELLS BY INTRODUCING CARBON OR FLUORINE IONS INTO BOTTOM OF STI GROOVE

RELATED APPLICATIONS

This application claims priority from Provisional Application Ser. No. 60/155,554 filed on Sep. 24, 1999 entitled: "ENHANCED SHALLOW TRENCH ISOLATION BY ION IMPLANTATION", the entire disclosure of which is hereby incorporated by reference herein.

FIELD OF THE INVENTION

The present invention relates to a method of manufacturing a plurality of semiconductor devices, e.g., MOS and CMOS transistors and integrated circuits containing such transistors, on a common semiconductor substrate, with improved processing methodology resulting in increased reliability and quality, increased manufacturing throughput, and reduced fabrication cost. The present invention has particular applicability in fabricating high-density integration semiconductor devices with design features below about 0.18 $\mu$m, e.g., about 0.15 $\mu$m and under.

BACKGROUND OF THE INVENTION

The escalating requirements for high density and performance associated with ultra-large-scale integration (ULSI) semiconductor devices require design features of 0.18 $\mu$m and below, such as 0.15 $\mu$m and below, increased transistor and circuit speeds, high reliability, and increased manufacturing throughput for economic competitiveness. The reduction of design features to 0.18 $\mu$m and below challenges the limitations of conventional semiconductor manufacturing techniques.

A conventional approach for forming a plurality of active devices in or on a common semiconductor substrate, e.g., as in the case of forming CMOS devices comprising PMOS and NMOS transistors in spaced adjacency, involves division of a starting material, i.e., a semiconductor substrate of suitable characteristics, into active regions where the transistors are to be formed, and field dielectric regions that electrically isolate adjacent active regions.

According to current technology, the starting material may comprise a lightly-doped p-type epitaxial layer ("epi" layer) grown on a heavily-doped p-type substrate. The low resistance of the heavily doped substrate is needed to minimize susceptibility to latch-up; whereas the light doping of the epi layer permits independent tailoring of the doping profiles of both the p- and n-wells formed therein as part of the fabrication sequence, thereby resulting in optimal PMOS and NMOS transistor performance.

The use of very thin epi layers, i.e., about 4 $\mu$m thick, is made possible by performing the isolation processing by means of shallow trench isolation (STI) techniques rather by high temperature local oxidation of silicon ("LOCOS"). The former technique advantageously minimizes up-diffusion of p-type dopant from the more heavily-doped substrate into the lightly-doped epi layer. In addition, and critical for fabrication of devices with a design rule of 0.25 $\mu$m and below. STI allows for closer spacing of adjacent active areas by avoiding the "bird's beak" formed at the edge of each LOCOS isolation structure. STI also provides better isolation by creating a more abrupt structure, reduces the vertical step from the active area to isolation to improve gate lithography control, eliminates the high temperature field oxidation step that can cause problems with large diameter, i.e., 8 inch, wafers, and is scalable to future logic technology generations.

Conventional STI methodology comprises initially forming a nitride masking layer over the surface of the substrate to differentiate the active (i.e., source/drain) regions and the field (i.e., isolation) regions, with a thin barrier oxide layer preliminarily formed beneath the nitride layer for relieving stress during oxidation. After nitride layer formation, a source/drain mask is utilized for defining the active areas in a resist layer formed over the nitride layer. After masking, the nitride layer is etched away from the field (isolation) areas while the resist protects the active areas. The STI process continues the source/drain etch through the nitride and barrier oxide layers into the underlying silicon; whereas, in conventional LOCOS processing, etching is stopped at the barrier oxide layer. After a trench of a desired depth is etched into the silicon, the source/drain resist mask is removed, and a thin liner oxide layer is formed as to round the top and bottom corners of the trench to prevent gate oxide reliability problems and improve subsequent trench fill. Next, a thick oxide layer is deposited which fills the active regions and covers the nitride layer over each active region. The thick oxide layer is then planarized to remove all the oxide over the active regions leaving the isolation trenches filled with oxide. The nitride is then stripped off the active regions.

Following division of the substrate, typically a silicon wafer, into active and isolation regions, the wafer is further subdivided into n-well and p-well regions in which the p- and n-channel transistors, respectively, will be formed. In a true "twin-tub" process both the n- and p-wells are implanted, rather than leaving the p-type epi layer untouched as the p-well. Consequently, each well profile can be independently tailored in the lightly-doped epi layer to optimize n- and p-channel transistor performance. Well doping is kept sufficiently low such that body effect (gamma) and source/drain-to-substrate capacitance do not degrade the transistors, but high enough such that off-state leakage current due to source-to-drain punch-through does not limit the minimum geometry transistors.

Typically, a retrograde-structured n-well is initially formed, by dopant implantation (e.g., phosphorus ions) at a sufficiently high energy to place the impurity concentration peak deep in the (silicon) substrate, while covering the p-well areas with resist. After stripping the resist and a rapid, low-temperature furnace anneal to activate the dopant, the n-well areas are masked with resist for performing the n-channel field implant. The n-channel field implant, typically boron ions, is implanted sufficiently deep to also serve as the p-well implant and increases the threshold of the n-channel transistors to improve isolation between adjacent active areas within the p-well. The process continues with a series of additional implants for setting the threshold (i.e., turn-on) voltage of each of the n- and p-channel transistors, gate formation, and transistor source/drain, source/drain extension implants, including post-implantation annealing, e.g., rapid thermal annealing (RTA) for implant activation and lattice damage relaxation.

While the above-described STI technology is considerably more amenable to fabrication of devices with a design rule of 0.18 $\mu$m and below than LOCOS methodology, the close proximity of the n- and p-wells in the vicinity of the narrow trench is problematic in terms of an increased likelihood of lateral interdiffusion of dopant impurities between the oppositely doped wells. particularly diffusion of boron dopant from the p-type well to the n-type well in the case of silicon, resulting in counterdoping of at least the proximal portions of adjacent wells. Moreover, notwithstanding the use of RTA rather than high temperature furnace-type post-implantation annealing for minimizing such dopant diffusion/interdiffusion, the extent of lateral dopant diffusion/interdiffusion and attendant deleterious effects can be significant, disadvantageously resulting in counterdoping of adjacent wells, reduction of isolation between adjacent active device regions, and degradation of other device characteristics.

Accordingly, there exists a need for improved semiconductor methodology for fabricating MOS and CMOS transistors and integrated circuit devices comprising a plurality of such transistors which does not suffer from the above-described drawbacks associated with the conventional methodology. There exists a need for an improved MOS/CMOS fabrication process fully compatible with conventional process flow which provides increased manufacturing throughput and product yield.

The present invention fully addresses and solves the above-mentioned problems and drawbacks attendant upon conventional processing for forming submicron-dimensioned MOS and CMOS transistors for use in high-density semiconductor integrated circuit devices. In accordance with embodiments of the present invention, prior to filling of the isolation trench or groove with a dielectric material, e.g., an oxide, a diffusion-inhibiting species is introduced into the surface of the semiconductor substrate exposed at the bottom of the trench or groove for preventing or substantially reducing lateral interdiffusion of dopant impurities from subsequently formed adjacent, oppositely doped well regions each having a terminus in the vicinity of the trench or groove. The diffusion-inhibiting species is preferably selectively introduced via ion implantation of nitrogen, carbon, or fluorine ions, with the previously formed resist layer in place for acting as a masking material. The implanted region below the surface of the trench bottom advantageously functions as a wall or barrier effectively preventing lateral diffusion of dopant, particularly boron p-type dopant from the p-well to the adjacent phosphorus-doped n-type well.

DISCLOSURE OF THE INVENTION

An advantage of the present invention is an improved method for manufacturing submicron-dimensioned MOS/CMOS transistors in or on a common semiconductor substrate and integrated circuit semiconductor devices comprising same.

Another advantage of the present invention is an improved method for forming MOS/CMOS semiconductor devices formed in or on a common semiconductor substrate and utilizing shallow trench isolation.

Still another advantage of the present invention is an improved method for manufacturing silicon-based MOS/CMOS transistor devices in or on a common substrate, with no or substantially reduced diffusion of boron dopant impurities from a p-type well region into an adjacent n-type well region.

A further advantage of the present invention is a silicon-based MOS/CMOS transistor device utilizing shallow trench isolation and having no or substantially reduced diffusion of boron dopant impurities from a p-type well region into an adjacent n-type well region.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of manufacturing a semiconductor device, which method comprises the sequential steps of:

(a) providing a semiconductor substrate having upper and lower major surfaces;

(b) forming a shallow trench isolation (STI) groove in the upper surface of the semiconductor substrate, the groove having first and second opposed, vertically extending sidewalls spaced apart a preselected distance and a bottom surface at a preselected depth below the upper major surface;

(c) selectively introducing a diffusion inhibiting species into the substrate at the bottom surface of the STI groove for preventing or substantially reducing lateral interdiffusion of dopant impurities from subsequently formed well regions of opposite conductivity type;

(d) forming in the substrate a first conductivity type first well region including first conductivity type dopant impurities, the first well region having a terminus at one of the first and second sidewalls or at the bottom surface of the STI groove and laterally extending therefrom in a first direction; and (e) forming in the substrate a second conductivity type second well region including second conductivity type dopant impurities, the second well region being spaced apart from the first well region, having a terminus at the other one of the first and second sidewalls or at the bottom surface of the STI groove, and laterally extending therefrom in a second direction, wherein lateral diffusion of the dopant impurities from the first well region into the second well region, and vice versa, is substantially reduced or prevented due to the selective introduction of the dopant diffusion inhibiting species into the bottom surface of the STI groove.

In embodiments according to the invention, steps (d) and (e) collectively comprise forming one of the first and second wells as a p-type well comprising p-type dopant impurities and the other of the first and second wells as an n-type well comprising n-type dopant impurities, wherein steps (d) and (e) each comprise selectively introducing respective dopant impurities into the upper major surface of the substrate by diffusion or ion implantation; step (c) comprises selectively introducing the diffusion inhibiting species into the bottom surface of the STI groove by ion implantation, comprising selectively implanting boron diffusion inhibiting ions selected from nitrogen, carbon, and fluorine ions at a preselected dosage ions/$cm^2$ and an energy of from about 2 KeV to greater than about 100 KeV; step (d) or step (e) comprise forming the p-type well-region by selectively introducing boron dopant impurities into a portion of the upper major surface of the substrate; step (a) comprises providing a semiconductor substrate comprising a doped silicon wafer of one conductivity type or a doped silicon substrate of one conductivity type having a doped epitaxial silicon layer of the one conductivity type formed on the upper major surface thereof; and step (b) comprises forming an STI groove having spaced-apart, opposed, vertically extending sidewalls and a bottom surface at a preselected depth below the upper major surface of the substrate.

Embodiments according to the present invention comprise the further steps of filling the implanted STI groove of step (c) with a dielectric material prior to performing step (d), and the further steps of (f) forming a PMOS transistor in the n-type well, and (g) forming an NMOS transistor in the p-type well.

According to another aspect of the present invention, a method of manufacturing a silicon-based CMOS transistor comprises the sequential steps of:

(a) providing a silicon semiconductor substrate having upper and lower major surfaces;

(b) forming a shallow trench isolation (STI) groove in the upper major surface of the silicon substrate, the groove having first and second opposed, vertically extending sidewalls spaced apart a preselected distance and a bottom surface at a preselected depth below the upper major surface;

(c) selectively introducing a dopant diffusion inhibiting species into the substrate at the bottom surface of the STI groove for preventing or substantially reducing lateral inter-diffusion of dopant impurities between subsequently formed well regions of opposite conductivity type;

(d) filling the thus-implanted STI groove with a dielectric material;

(e) forming in the substrate a p-type conductivity first well region comprising p-type dopant impurities, the first well region having a terminus at the first sidewall or at the bottom surface of the STI groove and laterally extending therefrom in a first direction;

(f) forming in the substrate an n-type conductivity second well region comprising n-type dopant impurities, the second well region having a terminus at the second sidewall or at the bottom surface of the STI groove and laterally extending therefrom in a second direction;

(g) forming an NMOS transistor in the p-type first well region; and (h) forming an NMOS transistor in the n-type second well region, wherein lateral diffusion of the dopant impurities from the first well region into the second well region, and vice versa, is substantially reduced or prevented due to the selective introduction of the dopant diffusion inhibiting species into the bottom surface of the STI groove.

According to still another aspect of the present invention, improved submicron-dimensioned silicon-based MOS and/or CMOS transistor devices made according to the method of the above-mentioned steps (a)–(h) and having reduced lateral interdiffusion of dopant impurities between adjacent well regions, are provided.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWING

Reference is made to the attached drawing, which is to be taken together with the following detailed description for a full understanding of the features and advantages provided by the present invention, wherein:

FIG. 1 illustrates, in simplified cross-sectional form, a portion of a semiconductor substrate subjected to processing for forming improved CMOS transistor semiconductor devices according to an embodiment of the method of the present invention.

DESCRIPTION OF THE INVENTION

Referring to FIG. 1, the present invention advantageously utilizes standard CMOS-STI fabrication methodology, as previously described, through the etching step for forming the STI groove. That is, a nitride masking layer (not shown) is first deposited or otherwise formed over the upper major surface of a suitable semiconductor substrate 1, typically a silicon wafer, to differentiate the active (i.e., source/drain) regions and the field (i.e., isolation) regions, with a thin barrier oxide layer (not shown) being preliminarily formed beneath the nitride layer for relieving stress during oxidation. After nitride layer formation, a source/drain mask is utilized for defining the active areas in a resist layer 2 formed over the nitride layer. After masking, the nitride layer is etched away from the field (i.e., isolation) areas while the patterned resist layer 2 protects the active areas. The STI groove 3 is then formed by continuing the source/drain etch through the nitride and barrier oxide layers for a preselected depth d into the underlining semiconductor substrate 1. For monocrystalline silicon wafer substrates, the STI groove 3 typically comprises a pair of opposed, vertically extending sidewalls 4 having a spacing s and a bottom surface 5 at a depth d below the substrate upper major surface 6.

The thus-formed STI groove 3 may then receive a thin liner oxide layer (not shown) covering the sidewalls 4 and bottom surface 5 thereof for rounding the top and bottom corners of the groove or trench to prevent gate oxide reliability problems and improve subsequent to filling the groove with dielectric isolation material. In embodiments of the present invention, the patterned resist layer 2 is not removed at this stage of the processing sequence, but rather is retained as an implantation mask for performing the inventive step of selective introduction of a dopant diffusion inhibiting into the bottom surface 5 of the STI isolation groove 3 for substantially reducing or preventing lateral interdiffusion of dopant impurities between opposite conductivity type well regions 7, 8 to be formed in the vicinity of the STI groove 3 in a subsequent processing step.

As schematically illustrated in FIG. 1, each of the subsequently formed opposite conductivity type well regions 7, 8 has a terminus 7', 7", 8', 8" at a respective proximal sidewall 4 or at the bottom surface 5 of the STI groove, depending upon the particular dopant introduction conditions (e.g., diffusion times or implantation energies) employed for their formation, and each well region laterally extends in the semiconductor substrate 1 in opposing directions away from the STI groove 2. Since the groove width, determined by the sidewall spacing s, is very small in sub-micron-dimensioned CMOS transistor devices having design rules below about 0.18 $\mu$m, e.g., below about 0.15 $\mu$m, thermally induced lateral diffusion of dopant impurities from a well region of one conductivity type to the adjacent well region of opposite conductivity type can readily occur as a result of subsequent processing steps performed at elevated temperatures, particularly with highly mobile boron p-type dopant impurities used with silicon substrates. As previously indicated, such counterdoping of the well regions 7, 8 can adversely affect electrical isolation of adjacent active regions as well as the transistor characteristics of the MOS transistors subsequently formed within the well regions.

According to the inventive method, a step for selectively introducing a dopant diffusion inhibiting species into the bottom surface 5 of the STI groove 3 is performed prior to filling the groove with a dielectric isolation material and removal of the patterned resist layer 2, as well as prior to formation of the opposite conductivity type well regions 7, 8. In an illustrative, but non-limitative embodiment according to the invention, a boron diffusion inhibiting species 9 selected from nitrogen, carbon, and fluorine ions is selectively implanted into the bottom surface 5 of the STI groove or trench 3 at a preselected dosage and an energy of from about 2 KeV to greater than about 100 KeV, while utilizing the remaining patterned resist layer 2 used for the STI groove etch as an implantation mask. Resultingly, a region 10 containing the implanted boron diffusion-inhibiting species 9 is formed beneath the bottom surface 5 of the STI groove 3 which effectively inhibits or blocks lateral dopant interdiffusion between the subsequently formed, opposite conductivity type well regions 7, 8.

In a subsequent step, the sidewall and bottom surfaces 4, 5, respectively, of the STI groove 3 receive a thin liner oxidation, if not performed prior to the diffusion-inhibiting implantation step, to round the top and bottom corners of the groove or trench to prevent gate reliability problems and to improve trench fill, respectively. The STI groove is then filled with a dielectric isolation layer, typically of an oxide material, e.g., an oxide derived from tetraethyl orthosilicate (TEOS), and PMOS and NMOS transistors are then formed in the respective n-well and p-well regions by conventional processing techniques not described herein in detail for brevity, e.g., by dopant diffusion or implantation.

The present invention enables the manufacture of various types of semiconductor devices employing a common substrate, and has particular industrial applicability in the manufacture of submicron-dimensioned, high density integration semiconductor devices having a design rule of about 0.18 μm and under, in that the inventive methodology effectively reduces or substantially eliminates deleterious counterdoping of closely spaced regions of opposite conductivity type as are formed in such devices.

The present invention can be advantageously implemented by employing conventional materials, methodology, and equipment. Accordingly, the details of such conventional materials, methodology, and equipment are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed:

1. A method of manufacturing a semiconductor device, which method comprises the sequential steps of:
   (a) providing a semiconductor substrate having upper and lower major surfaces;
   (b) forming a shallow trench isolation (STI) groove in said upper major surface of said semiconductor substrate, said groove having first and second opposed, vertically extending sidewalls spaced apart a preselected distance and a bottom surface at a preselected depth below said upper major surface;
   (c) selectively introducing carbon ions or fluorine ions as a diffusion inhibiting species into said substrate at said bottom surface of said STI groove for preventing or substantially reducing lateral interdiffusion of dopant impurities from subsequently formed well regions of opposite conductivity type;
   (d) forming in said substrate a first conductivity type first well region including first conductivity type dopant impurities, said first well region having a terminus at one of said first and second opposed sidewalls or at said bottom surface of said STI groove and laterally extending therefrom in a first direction; and
   (e) forming in said substrate a second conductivity type second well region including second conductivity type dopant impurities, said second well region being spaced apart from said first well region, having a terminus at the other one of said first and second opposed sidewalls or at said bottom surface of said STI groove, and laterally extending therefrom in a second direction, wherein lateral diffusion of said dopant impurities from said first well region into said second well region, and vice versa, is substantially reduced or prevented due to said selective introduction of said carbon ions or fluorine ions as the dopant diffusion inhibiting species into said bottom surface of said STI groove.

2. The method as in claim 1, wherein steps (d) and (e) collectively comprise forming one of said first and second well regions as a p-type well comprising p-type dopant impurities and the other of said first and second wells as an n-type well region comprising n-type dopant impurities.

3. The method as in claim 2, wherein steps (d) and (e) each comprises selectively introducing respective dopant impurities into said upper major surface by diffusion or ion implantation.

4. The method as in claim 1, wherein step (c) comprises selectively introducing said diffusion inhibiting species into the bottom surface of said STI groove by ion implantation.

5. The method as in claim 1, wherein step (c) comprises selectively implanting fluorine ions as the diffusion-inhibiting species.

6. The method as in claim 5, wherein step (c) comprises implanting said diffusion inhibiting ions at a preselected dosage and an energy of from about 2 KeV to greater than about 100 KeV.

7. The method as in claim 3, wherein step (d) or step (e) comprises forming said p-type well by selectively introducing boron dopant impurities into a portion of the upper major surface of the substrate.

8. The method as in claim 7, wherein step (a) comprises providing a semiconductor substrate comprising a doped silicon wafer of one conductivity type or a doped silicon substrate of one conductivity type having a doped epitaxial silicon layer of said one conductivity type formed on a major surface thereof.

9. The method as in claim 8, wherein step (b) comprises forming an STI groove having spaced-apart, opposed, vertically extending sidewalls and a bottom surface at a preselected depth below said upper major surface.

10. The method as in claim 1, wherein step (c) comprises selectively implanting fluorine ions as the diffusion-inhibiting species.

11. The method as in claim 10, wherein step (c) comprises selectively implanting said diffusion inhibiting ions at a preselected dosage and an energy of from about 2 KeV to greater than about 100 KeV.

12. The method as in claim 11, further comprising the step of:

filling the STI groove implanted in step (c) with a dielectric material prior to performing step (d).

13. The method as in claim 12, further comprising the steps of:

(f) forming a PMOS transistor in said n-type well region; and (g) forming an NMOS transistor in said p-type well region.

14. A silicon CMOS semiconductor device with enhanced shallow trench isolation (STI) produced by the method of claim 13.

15. A method of manufacturing a silicon-based CMOS transistor device, which method comprises the sequential steps of:

(a) providing a silicon semiconductor substrate having upper and lower major surfaces;

(b) forming a shallow trench isolation (STI) groove in said upper major surface of said silicon substrate, said groove having first and second opposed, vertically extending sidewalls spaced apart a preselected distance and a bottom surface at a preselected depth below said upper major surface;

(c) selectively introducing carbon ions or fluorine ions as a dopant diffusion inhibiting species into said substrate at said bottom surface of said STI groove for preventing or substantially reducing lateral inter-diffusion of dopant impurities from subsequently formed well regions of opposite conductivity type;

(d) filling the thus-implanted STI groove with a dielectric material;

(e) forming in said substrate a p-type conductivity first well region comprising p-type dopant impurities, said first well region having a terminus at said first sidewall or at said bottom surface of said STI groove and laterally extending therefrom in a first direction;

(f) forming in said substrate an n-type conductivity second well region comprising n-type dopant impurities, said second well region having a terminus at said second sidewall or at said bottom surface of said STI groove and laterally extending therefrom in a second direction;

(g) forming an NMOs transistor in said p-type first well region; and (h) forming a PMOS transistor in said n-type second region, wherein lateral diffusion of said dopant impurities between said first well region and said second well region is substantially or prevented due to said selective introduction of said carbon ions or fluorine ions as the dopant diffusion inhibiting species into said bottom surface of said STI groove.

16. The method as in claim 15, wherein step (a) comprises providing a doped monocrystalline silicon wafer of one conductivity type or a doped silicon substrate of one conductivity type having a doped epitaxial layer of said one conductivity type formed on said upper major surface.

17. The method as in claim 16, wherein step (b) comprises forming an STI groove having spaced-apart, opposed, vertically extending sidewalls and a bottom surface at a preselected depth below said major surface.

18. The method as in claim 17, wherein step (e) comprises implanting fluorine ions as the dopant inhibiting species.

19. The method as in claim 18, wherein step (c) comprises implanting carbon ions at a preselected dosage and energy as the dopant diffusion inhibiting species.

20. A silicon-based CMOS transistor device with enhanced shallow trench isolation (STI) produced by the method of claim 19.

* * * * *

UNITED STATES PATENT AND TRADEMARK OFFICE
CERTIFICATE OF CORRECTION

PATENT NO.   : 6,514,833 B1  
DATED        : February 4, 2003  
INVENTOR(S)  : Emi Ishida et al.

It is certified that error appears in the above-identified patent and that said Letters Patent is hereby corrected as shown below:

<u>Column 8,</u>
Line 43, change "fluorine" to -- carbon --

Signed and Sealed this

Twenty-second Day of April, 2003

JAMES E. ROGAN
*Director of the United States Patent and Trademark Office*